Figure 1:
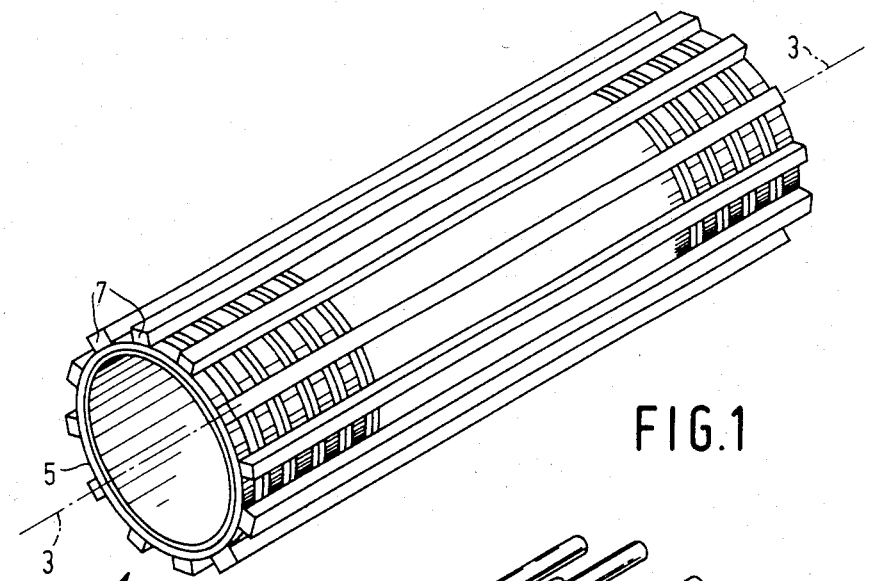

United States Patent [19]
Zijlstra

[11] Patent Number: 4,612,505
[45] Date of Patent: Sep. 16, 1986

[54] NUCLEAR MAGNETIC RESONANCE APPARATUS

[75] Inventor: Hinne Zijlstra, Eindhoven, Netherlands

[73] Assignee: U.S. Philips Corporation, New York, N.Y.

[21] Appl. No.: 618,800

[22] Filed: Jun. 8, 1984

[30] Foreign Application Priority Data

Oct. 14, 1983 [NL] Netherlands ................ 8303535

[51] Int. Cl.⁴ .............................................. G01R 33/20
[52] U.S. Cl. ..................................... 324/318; 324/300
[58] Field of Search ................ 335/216, 299; 324/300, 324/318, 319, 320, 322

[56] References Cited

U.S. PATENT DOCUMENTS 3,423,670 1/1969 Parker et al. ...................... 324/320
4,490,675 12/1984 Knuettel ........................... 324/318

Primary Examiner—Michael J. Tokar
Attorney, Agent, or Firm—Robert T. Mayer; Algy Tamoshunas

[57] ABSTRACT

A nuclear magnetic resonance apparatus comprises an electromagnetic system in which a shield of a magnetic material is arranged about the coil system for the homogeneous magnetic field. By providing the magnetic material, for example soft iron, directly about the coil system, a comparatively compact magnet with an intensified, interference-insensitive homogeneous magnetic field is obtained. Instead of using a closed cylinder, use can alternatively be made of a cylinder which is formed by rods. The latter is notably attractive for shielding at a larger distance, the original field in the coil then being influenced to only a minor extent. A similar shielding can be obtained by means of a Helmholtz coil pair.

9 Claims, 5 Drawing Figures

NUCLEAR MAGNETIC RESONANCE APPARATUS

The invention relates to a nuclear magnetic resonance apparatus, comprising a magnet which has an electromagnetic coil system for generating a homogeneous magnetic field in an examination space which is enclosed by the magnet. The invention also relates to a magnet for such an apparatus.

An apparatus of this kind is known in the form of a nuclear magnetic resonance tomography apparatus from Computertomografie 1 (1981), pages 2–10. Comparatively strong stray fields occur outside the magnet in such apparatus. These stray fields are extensively dealt with in an article in Diagnostic Imaging, April 1983, pages 32–35. The article mentions that such stray fields do not occur in a magnet system which is composed of permanent magnets. The drawbacks of such a magnet system are also mentioned in this article. The drawback of external stray fields is not only that they are so strong, notably in the case of nuclear magnetic resonance tomography apparatus and that they have a disturbing effect on equipment outside the magnet, but also that the measurement field in the magnet is liable to be disturbed by external variations in the stray field, for example, by displacement of large pieces of magnetic material therein. As regards nuclear magnetic resonance apparatus comprising super-conducting magnets such as notably used for diagnostic nuclear magnetic resonance apparatus, it is to be noted that the magnet field and hence also the stray field are always present. For a more detailed description of super-conducting magnets for notably diagnostic nuclear magnetic resonance tomography apparatus and medical nuclear magnetic resonance spectroscopy apparatus, reference is made to the chapter "Superconductivity", pages 116–127, of the book "Nuclear Magnetic Resonance Imaging", by C. L. Partain et all, WB Saunders Company, 1983; this type of imaging will be referred to hereinafter as NMR imaging.

For adequate shielding of the external stray field of magnets comprising electromagnetic coils for generating a high field intensity in a comparatively large space, as is the case in diagnostic nuclear magnetic resonance examinations, the use of a yoke corresponding to the frame of the permanent magnet described in "Diagnostic Imaging" requires a large amount of soft magnetic material.

It is the object of the invention to provide a nuclear magnetic resonance apparatus which comprises an electromagnetic coil system for generating a homogeneous magnetic field and in which the external magnetic stray field is strongly reduced even though a minimum amount of magnetic shielding material is used. To this end, a nuclear magnetic resonance apparatus of the kind set forth in accordance with the invention is characterized in that a shield for the external magnetic stray field of the coil system is arranged coaxially about the electromagnetic coil system.

Because the external magnetic stray field is reduced in a nuclear magnetic resonance apparatus in accordance with the invention, the disturbing effects thereof no longer occur. This substantially simplifies the steps to be taken for the operation and installation of the apparatus. Also avoided are possible adverse effects on the homogeneity of the magnetic field in the measurement space by the external influence of the stray field which could occur in the known apparatus.

In a preferred embodiment, a cylinder of a soft magnetic material, i.e. a material having a high permeability, is provided directly about an electromagnetic coil system which is formed, for example, by a solenoid or preferably by a number of annular windings in order to obtain a homogeneous field distribution in the measurement space. The cylinder may be composed, for example of a sleeve or of a number of rods of a soft magnetic material which are uniformly distributed over a cylindrical surface. Thus, the electromagnetic coil and the shielding cage together form a magnetic coil with a strongly reduced stray field in the radial direction. The cylinder of a soft magnetic material is notably accommodated, together with the current windings of the magnet, in a Dewar vessel for the superconducting magnet coil. The shielding may then be comparatively short and less heavy so that, also considering the substantially smaller diameter, a substantially saving in weight can be achieved. The shielding can be improved by providing the sleeve at its axial ends with a closing member which is bent towards the axis. It is an advantage of this construction that the magnetic field in the measurement space is intensified by the shielding, while at the same time improving the shielding against disturbance of the field in the measurement space by the environment. Moreover, the magnetic field at the area of the current conductors of the superconducting coil is comparatively weak. The latter property allows for a higher persistent current through the conductors. The mechanical forces on the windings are thus also reduced.

The cage in a further preferred embodiment is arranged about a known, for example superconducting, electromagnetic coil system of a nuclear magnetic resonance tomography apparatus or a nuclear magnetic resonance spectrometer. In such systems the radial distance between the actual coil and the shielding cage is bound to a minimum value by the construction of the coil system, for example by the cooling system in the case of a superconducting coil. It is desirable, however, for the shielding to be readily installed on site, notably if it consists of loose rods which are then stacked on a suitable support around the coil system. The mass of metal which is still comparatively large can thus be delivered and installed in parts which can be easily handled.

The shielding can be further improved by providing the rods with radially inwards directed connections at their axial ends. The connections then extend at least substantially as far as the windings of the actual magnet coil. For suitable shielding, the length of the rods is preferably chosen so as to be larger than the relevant length of the magnet coil. For the shielding of known magnets, the length should be, for example from 4 to 6 m in the case of a coil system having a length of approximately 2 m.

The cage in a preferred embodiment comprises, for example, from 8 to 24 uniformly spaced rods of a magnetic soft iron, each rod having a transverse dimension of, for example from 1.0 to 2.5 cm$^2$. For a shield which is mounted directly about the coil system, a comparatively small number of rods suffices; these rods need be only slightly longer than the coil system. Notably in this case the use of a sleeve is less objectionable, because the magnet now forms one integral unit with the shield.

If the apparatus is installed so that stray fields in the direction of the floor supporting the apparatus are not annoying or are shielded by provisions made in the floor, a shield in the form of substantially one half cylinder suffices.

In a further preferred embodiment, the shield is premagnetized so that it can generate an at least partly compensating field already without stray field. In the case of a shield in the form of rods, each of the rods may be provided with a current winding or with a strong permanent magnetic material for this purpose. In the case of a sleeve, it can be provided as a whole with a current winding or with a ring of a permanent magnetic material.

In a further preferred embodiment, the shields is formed by a coil pair which is arranged at a comparatively large radial distance from the coil system, more or less as a Helmholtz coil pair, in order to generate a magnetic field which compensates for the stray field. It is an advantage of this shield that the field of the coil system is also compensated for in the axial direction. However, care must be taken that the axial measurement field is not affected by the field of the shielding coils. A coil pair of this kind can also be used in conjunction with a shield consisting of a soft magnetic material. An optimum division of tasks between the two shields can then be achieved, so that on the one hand a smaller amount of magnetic material suffices while on the other hand the current intensity through the shielding coils can be reduced. An attractive combination can be realized by accommodating the magnetic shielding sleeve as well as the shielding coils in a Dewar vessel which is to be filled with helium. The shielding coils can again be constructed so that they are optimally excited by the stray field of the actual magnet.

Figure 2:
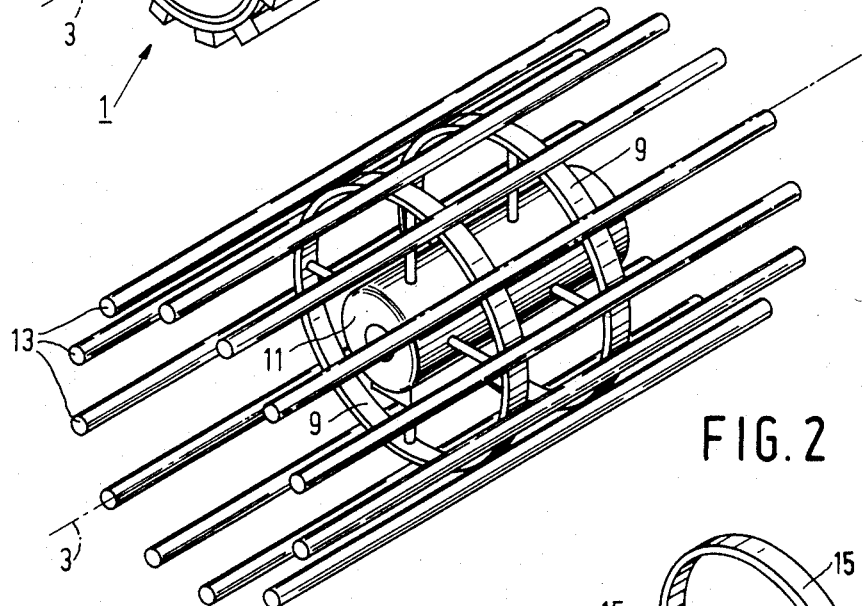
Figure 3:
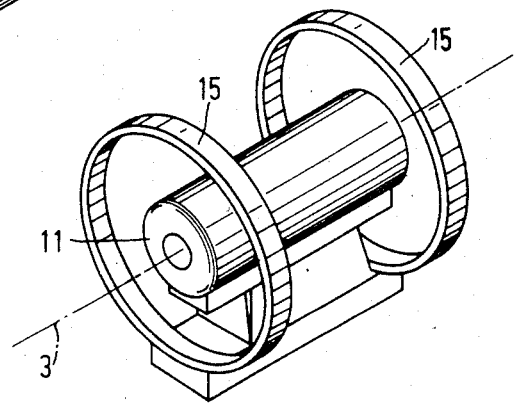
Figure 4:
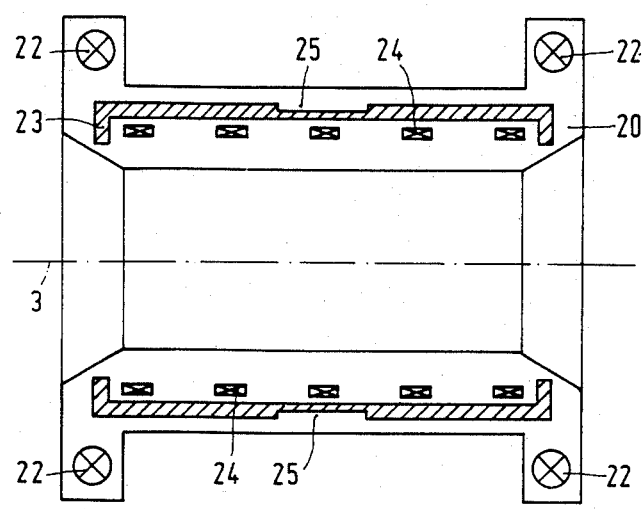
Figure 5:
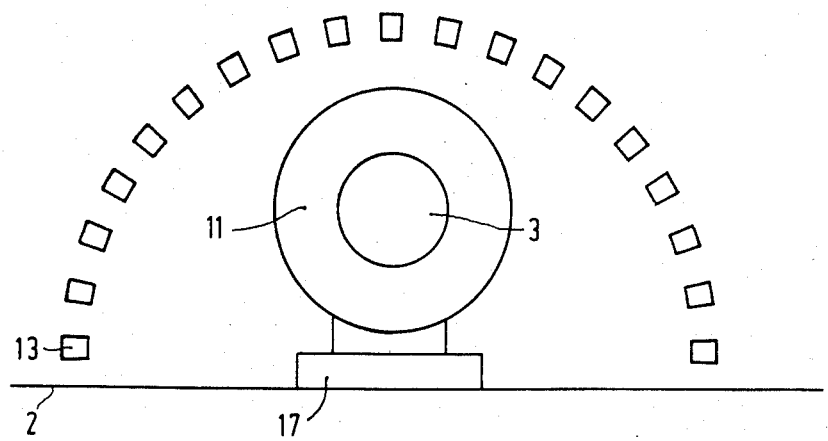

Some preferred embodiments in accordance with the invention will be described in detail hereinafter with reference to the drawing, wherein:

FIG. 1 shows a shielded electromagnetic coil for a nuclear magnetic resonance apparatus in accordance with the invention, FIG. 2 shows a magnet coil for a nuclear magnetic resonance apparatus comprising a shield in accordance with the invention, FIG. 3 shows a magnet of such an apparatus which is shielded by means of a Helmholtz coil pair, FIG. 4 shows an embodiment in which the magnetic shield as well as the shielding coil pair are accommodated in a Dewar vessel, and FIG. 5 shows a shield for an adapted space.

A shielded electromagnet as shown in FIG. 1 comprises an electromagnetic coil system 1. This coil system may be formed by a solenoid or by a number of current windings which are arranged about a common axis 3 of the magnet. Even though in the first instance a resistance magnet will be used for this construction, the use of a superconducting system is not precluded. In this case the coil system is arranged, for example, against the inner side of a plastic cylindrical sleeve 5. Around the sleeve 5 there is provided a cylinder 7 of a soft magnetic material, for example, magnetic soft iron. In the embodiment shown, the cylinder 7 is composed of a number of (in this case 12) soft iron rods which are arranged so as to be evenly distributed across the cylindrical surface of the cylinder. The cylinder 7 may alternatively consist of a sleeve of a soft magnetic material. In comparison with customary magnets for nuclear magnetic resonance tomography apparatus and the like, not only shielding of the stray field is thus achieved, but for the same energy consumption a substantially stronger magnetic field is obtained. The disturbing of the measurement field by external variations of the stray field which occur in known magnets have also been eliminated to a substantial degree.

Using this magnet, a magnetic field of approximately 0.25 tesla can be generated in a measurement space having a diameter and a length of approximately 0.5 m. The magnet then has an external diameter of approximately 1.25 m and a length of 2.5 m, its weight being approximately 15 tons; it requires a power supply of approximately 100 kW.

The radial stray field is then reduced to less than 0.01 tesla measured at a radial distance of 1 m from the axis 3 and less than 0.001 tesla at a distance of 3 m from the axis. The rods of the shield have a cross-section of, for example $0.1 \times 0.05$ m$^2$.

As shown in FIG. 2, a more or less similar construction can also be used for the shielding of a magnet which is known per se. The magnet 11, which may in this case be a resistance magnet as well as a superconducting magnet, is shielded at a radial distance of, for example 2 m by a number of, for example 12 magnetic soft iron rods 13. Preferably, the rods are now substantially longer than the magnet 11; for example, their length is from 4 to 6 m for a length of 2.5 m of the magnet. The advantage of rods over a closed cylinder is notably the ease of handling during transport and assembly of the apparatus. Each of the rods is, for example, from 4 to 6 m long and weighs approximately 500 kg when its cross-section is $0.1 \times 0.1$ m$^2$. The rods can be stacked on site in a frame 9 (diagrammatically shown) around the magnet. In order to improve the shielding, the rods may be provided with radially inwards directed extensions at their ends. As a result, the length of the rods may then be smaller.

FIG. 3 shows an embodiment in which the shielding is realized by a coil pair 15. Contrary to the previously described, more passive shielding, active shielding is now achieved by a compensating field of the coils. The coils 15 have a diameter of, for example, 4 m. Another advantage of this shield is that the axial stray field of the magnet is also reduced. By choosing a suitable configuration of the wire windings, the energy required for the shielding coils can also be reduced; however, it still remains comparatively high, for example in the order of magnitude of 50 kW for a 0.3 tesla magnet. The energy consumption can be reduced by constructing the shielding coils as superconductors carrying persistent currents. To this end, each of the coils may be accommodated in an adapted helium Dewar vessel and be designed for excitation by a flux pump. Alternatively, the shielding coils may be composed of hollow, current carrying wires of superconducting material through which liquid helium is pumped for cooling. By choosing a suitable geometry, the already superconducting shielding coils can be excited to the correct value for shielding by induction from the measurement magnet. This is because the coils will then oppose the enclosed flux and compensate for this flux by a corresponding counter-flux.

FIG. 4 shows an embodiment of a magnet comprising a shielding sleeve 21 which is accommodated in a helium Dewar vessel 20 and shielding coils 22 which are also accommodated in a Dewar vessel. The shielding sleeve comprises end portions 23 which additionally force the magnetic field inwards. At the area of the superconducting windings 24 of the actual magnet coil, the magnet field is comparatively small in this construction so that, as has already been stated, the persistent currents may be larger, the intensity of the magnetic field can be increased, and the Lorentz forces on the windings are smaller. By forming recesses 25 in the sleeve, the shielding effect can be optimized and hence also the field in the measurement space in respect of local homogeneity of the field. In the sleeve, or a system of rods replacing the sleeve, a premagnetization can be formed by means of permanent magnetic material. Even though the described combination of a shielding sleeve and shielding coils has been described, one of the two shields can also be separately used. The shielding sleeve is then usually to be preferred.

FIG. 5 shows an embodiment of an apparatus which is arranged in a space where the floor 2 comprises a shield or where a stray field underneath the floor 2 is not objectionable. The magnet which is arranged on a base is now enclosed by a span of magnetic shielding rods. The geometry of the span can be adapted to the requirements of the user. The rods 13 are mounted on a support which is not shown.

What is claimed is:

1. A nuclear magnetic resonance apparatus, comprising a magnet which comprises an electromagnetic coil system for generating a homogeneous magnetic field in an examination space which is enclosed by the magnet, and a shield for the external stray field of the coil system arranged coaxially about the electromagnetic coil system, the shield comprising a plurality of rods of a soft magnetic material which are axially directed and uniformly spaced on at least a portion of a cylindrical surface which extends concentrically about the coil system, the length of said rods being at least equal to the axial length of the coil system.

2. A nuclear magnetic resonance apparatus as claimed in claim 1, wherein the rods are arranged directly about the coil system and forms one integral unit therewith.

3. A nuclear magnetic resonance apparatus as claimed in claim 1, wherein the rods are provided at their axial ends with radially inwards directed extensions which reach at least as far as the vicinity of the windings of the coil system.

4. A nuclear magnetic resonance apparatus as claimed in claims 1 or 3, wherein the magnet includes superconducting windings and the shield for external stray fields and the superconducting windings are accommodated in a Dewar vessel for liquid helium.

5. A nuclear magnetic resonance apparatus as claimed claims 1 or 3 wherein the soft magnetic material of the rods is premagentized.

6. A nuclear magnetic resonance apparatus as claimed in claim 5, wherein the rods are provided with a current winding for premagnetization.

7. A nuclear magnetic resonance apparatus as claimed in claim 5, wherein at least a piece of a permanent magnetic material is added to each of the rods.

8. A nuclear magnetic resonance apparatus as claimed in claim 1, wherein near the axial ends of the shield for external stray fields there is arranged a shielding coil which is accommodated in a Dewar vessel for liquid helium.

9. A nuclear magnetic resonance apparatus as claimed in claim 1, wherein said rods are spaced about the entire cylindrical surface.

* * * * *